United States Patent
Huang

(10) Patent No.: US 12,327,743 B2
(45) Date of Patent: Jun. 10, 2025

(54) PROCESS TOOL AND METHOD FOR HANDLING SEMICONDUCTOR SUBSTRATE

(71) Applicant: TAIWAN SEMICONDUCTOR MANUFACTURING COMPANY LIMITED, Hsin-Chu (TW)

(72) Inventor: Fung-Chih Huang, Hsinchu County (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 17/458,784

(22) Filed: Aug. 27, 2021

(65) Prior Publication Data
US 2023/0069085 A1    Mar. 2, 2023

(51) Int. Cl.
*H01L 21/677*    (2006.01)
*B65G 47/90*    (2006.01)
*H01L 21/67*    (2006.01)
*H01L 21/687*    (2006.01)

(52) U.S. Cl.
CPC ........ *H01L 21/67703* (2013.01); *B65G 47/90* (2013.01); *H01L 21/67167* (2013.01); *H01L 21/67742* (2013.01); *H01L 21/67748* (2013.01); *H01L 21/67778* (2013.01); *H01L 21/68707* (2013.01)

(58) Field of Classification Search
CPC ......... H01L 21/67703; H01L 21/67742; H01L 21/67109
See application file for complete search history.

(56) References Cited

U.S. PATENT DOCUMENTS

| | | | | |
|---|---|---|---|---|
| 7,288,491 | B2 * | 10/2007 | Collins | H01J 37/321 134/1 |
| 10,508,336 | B2 * | 12/2019 | Nakada | H01L 21/67109 |
| 2002/0132052 | A1 * | 9/2002 | Kumar | H01L 21/02282 118/724 |
| 2006/0241813 | A1 * | 10/2006 | Babu | H01L 21/67173 700/255 |
| 2010/0078045 | A1 * | 4/2010 | Toratani | B08B 5/00 118/715 |
| 2012/0060752 | A1 * | 3/2012 | Kiyotoshi | H01L 21/67742 118/52 |
| 2014/0377039 | A1 * | 12/2014 | Yang | H01L 21/67109 414/806 |
| 2015/0133044 | A1 * | 5/2015 | Kumagai | H01L 21/681 414/217 |

(Continued)

OTHER PUBLICATIONS

World Health Organization, "HVAC: Airflow patterns", May 2006, Slide 8 of 31, https://image.slideserve.com/1206797/slide8-1.jpg, accessed Dec. 19, 2023 (Year: 2006).*

*Primary Examiner* — Gerald McClain
(74) *Attorney, Agent, or Firm* — Cooper Legal Group, LLC

(57) ABSTRACT

A process tool for handling a semiconductor substrate as part of a semiconductor fabrication process includes a cooling station and a transport system, such as a front-end robot, for positioning the semiconductor substrate in the cooling station during a cooling operation. A method for handling the semiconductor substrate uses the transport system for positioning the semiconductor substrate in the cooling station during the cooling operation.

20 Claims, 6 Drawing Sheets

(56) References Cited

U.S. PATENT DOCUMENTS

| | | | |
|---|---|---|---|
| 2015/0144060 A1* | 5/2015 | Park | H01L 21/67109 |
| | | | 414/226.05 |
| 2017/0266700 A1* | 9/2017 | Nagakubo | H01L 21/6719 |
| 2019/0067055 A1* | 2/2019 | Zheng | H01L 21/67754 |
| 2021/0013064 A1* | 1/2021 | Yoon | H01L 21/6719 |

* cited by examiner

PROCESS TOOL AND METHOD FOR HANDLING SEMICONDUCTOR SUBSTRATE

BACKGROUND

During semiconductor fabrication, various layers are formed and processed, such as by etching, to establish semiconductor arrangements that have one or more features. As the features of semiconductor arrangements continue to become smaller, the fabrication processes become more susceptible to defects caused by the presence of contaminants introduced to the semiconductor substrates during fabrication. Sterile environments are established within process chambers to reduce the presence of contaminants therein. But handling systems for transferring between the process chambers and substrate carriers have the potential to introduce contaminants to these sterile environments and the semiconductor substrates being processed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
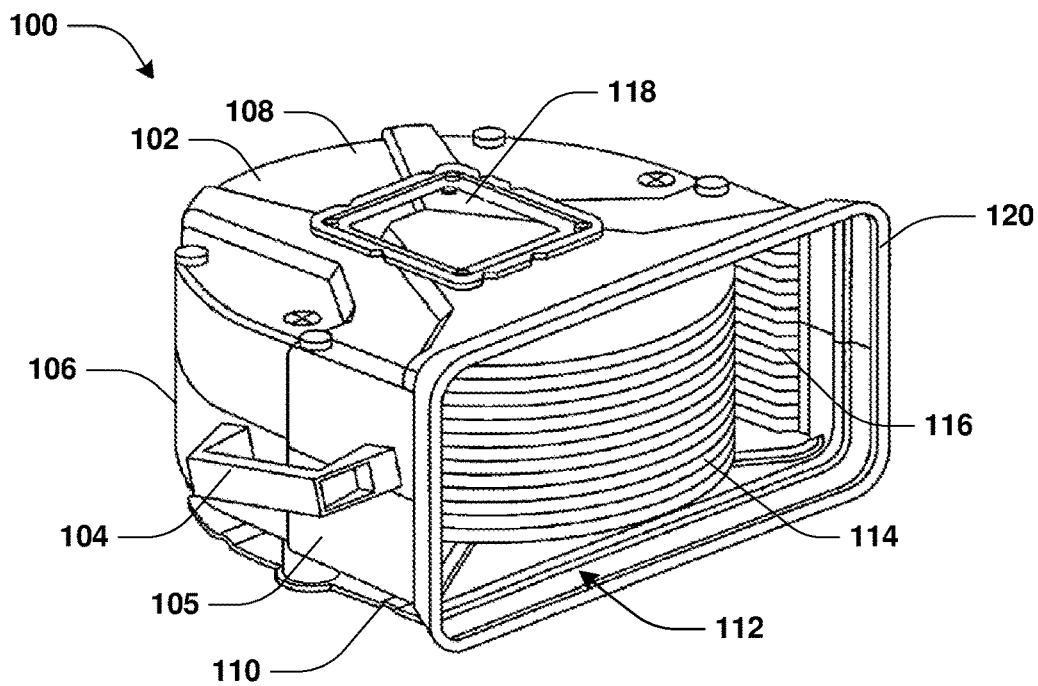
FIG. 1 illustrates a substrate carrier in accordance with some embodiments.

The following disclosure provides many different embodiments, or examples, for implementing different features of the provided subject matter. Specific examples of components and arrangements are described below to simplify the present disclosure. These are, of course, merely examples and are not intended limiting. For example, the formation of a first feature over or on a second feature in the description that follows may comprise embodiments in which the first and second features are formed in direct contact, and may also comprise embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments relate generally to a method and apparatus for handling semiconductor substrates removed from a load lock chamber of a processing tool and transferred to a substrate carrier, where the semiconductor substrates are processed through a cooling station prior to being loaded into the substrate carrier. According to some embodiments, a cooling gas, such as nitrogen, oxygen, or other suitable gas is provided in the cooling station. In some embodiments, a front-end interface unit comprises a substrate cooling station and a front-end robot that transfers semiconductor substrates from the load lock chamber to the cooling station and then to the substrate carrier. According to some embodiments, cooling the semiconductor substrates in the presence of the cooling gas in the cooling station prior to transferring the semiconductor substrates to the substrate carrier reduces condensation of material, such as water, on surfaces of the semiconductor substrates in the substrate carrier. Reducing condensation reduces defects. The provision of the semiconductor substrates in the cooling station also facilitates outgassing of volatile components from the surfaces of the semiconductor substrate, which also tends to reduce defects in subsequent processing operations. Cooling the semiconductor substrates using the cooling station increases throughput of the processing tool since convective heat transfer in the cooling station cools the semiconductor substrates more effectively than conductive heat transfer in the front-end interface unit without the cooling station. Increased throughput and reduced defects increases the efficiency of the fabrication process and potentially increases the performance and/or yield of semiconductor die fabricated on the semiconductor substrate.

In some embodiments, the cooling station introduces the cooling gas at a temperature of between about 68 and 290 degrees Fahrenheit (° F.) and a flow rate of between about 0.007 and 0.1 scfm to cool and outgas the semiconductor substrates prior to the semiconductor substrates being inserted into the substrate carrier. In some embodiments, the front-end robot transfers individual semiconductor substrates to the cooling station. In some embodiments, the front-end robot transfers multiple semiconductor substrates to the cooling station during the same operation. In some embodiments, the cooling station holds and cools one or more semiconductor substrates between transfers by the front-end robot.

With reference to the drawings, FIG. 1 illustrates a substrate carrier 100 in accordance with some embodiments. In some embodiments, the substrate carrier 100 comprises a semiconductor wafer pod, a cassette, a front opening unified pod, or a front opening universal pod (FOUP). A box shell 102 of the substrate carrier 100 is fitted with handles 104 for manually transporting the substrate carrier 100. The box shell 102 has side walls 105 and a rear wall 106, each extending between a top 108 and a bottom 110 of the box shell 102. In some embodiments, the box shell 102 has an opening 112 that is generally rectangular opposite the rear wall 106, although shapes such as circular, oval, etc. are contemplated. Semiconductor substrates 114, or wafers, are held inside the substrate carrier 100, spaced apart in a stack, and supported by either shelves 116 coupled to the side walls 105 or slots formed in a plurality of columns. In some embodiments, the top 108 of the box shell 102 has a handling flange 118 that can be engaged by a robotic handling system (not shown) to move the substrate carrier 100. On a bottom side of the substrate carrier 100, there may be a coupling plate that includes recess pockets to facilitate transport and self-locating placement of the substrate carrier 100. The substrate carrier 100 has a contact surface 120 around the opening 112. In some embodiments, the substrate carrier 100 comprises a removable door. The removable door interfaces with a processing tool 200 (see FIG. 2) that engages and removes the removable door to provide access to the semiconductor substrates 114 though the opening 112.

Figure 2:
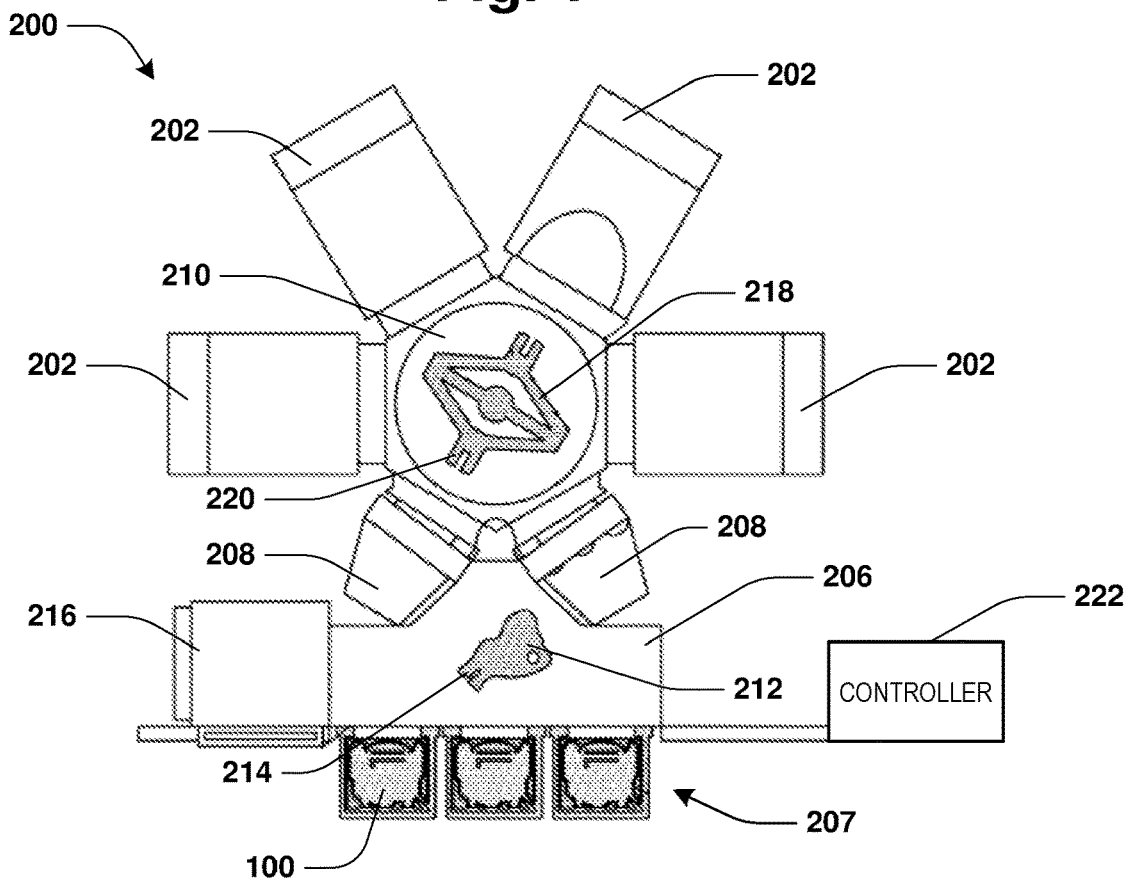
FIG. 2 illustrates a processing tool, in accordance with some embodiments.

FIG. 2 illustrates a processing tool 200, in accordance with some embodiments. The processing tool 200 includes one or more process chambers 202 for performing process operations integrated in a cluster arrangement. The processing tool 200 comprises a front-end interface unit 206, load lock chambers 208, and a transfer module 210. In some embodiments, the processing tool 200 includes only a single process chamber 202.

In some embodiments, the front-end interface unit 206 comprises a load port module 207 that engages one or more substrate carriers 100 through which the semiconductor substrates 114 are loaded and unloaded to and from the processing tool 200. In some embodiments, the front-end interface unit 206 comprises a front-end robot 212 having an end effector 214 for holding, manipulating, and/or transferring semiconductor substrates 114. In some embodiments, the front-end interface unit 206 is exposed to atmospheric pressure. According to some embodiments, the front-end interface unit 206 comprises a cooling station 216. The front-end robot 212 may transfer semiconductor substrates 114 from the substrate carriers 100 to one of the load lock chambers 208. After processing in the process chambers 202, the front-end robot 212 may transfer semiconductor substrates 114 from one of the load lock chambers 208 to the cooling station 216 and from the cooling station 216 to one of the substrate carriers 100.

The load lock chambers 208 are configured to create various atmospheres depending on, among other things, the next scheduled process operation for the semiconductor substrates 114. A gas content provided in a load lock chamber 208 may be altered by such mechanisms as adding purified gases or creating a vacuum, along with other suitable means for adjusting the atmosphere. When the desired atmosphere in the load lock chamber 208 has been reached, the corresponding door may be opened, and the semiconductor substrates 114 can be accessed. In some embodiments, the front-end interface unit 206 is associated with an atmospheric pressure, such as a standard atmosphere (1 atm). In some embodiments, the load lock chamber 208 pumps down a pressure within the load lock chamber 208 to a first pressure less than the standard atmosphere to facilitate a vacuum environment for substrate processing. In some embodiments, the load lock chamber 208 is configured to pump the pressure of the load lock chamber 208 down to around $10^{-4}$ torr.

In some embodiments, the transfer module 210 transfers the semiconductor substrates 114 between the process chambers 202 and the load lock chambers 208. In some embodiments, the transfer module 210 comprises one or more transfer robots 218 with one or more end effectors 220 for transferring the semiconductor substrates 114. In some embodiments, the transfer module 210 is configured to pump down the processing tool 200 to a second pressure different than the first pressure of the load lock chamber 208. For example, the second pressure is less than the first pressure. It will be appreciated that a pressure associated with a cluster tool, such as the processing tool 200 is dynamic and does not necessarily form distinct regions separated by a linear boundary. In this way, a vacuum environment is created to facilitate substrate processing, at least because two or more pressures are associated with the processing tool 200. For example, since the second pressure is less than the first pressure, the semiconductor substrates 114 are exposed to lower pressures as processing occurs. Therefore, the exposure to a subsequent pressure lower than a previous pressure mitigates media, such as moisture, condensation, dust, contaminants, etc. from interfering with substrate processing. In this way, a process path associated with substrate fabrication is formed so the semiconductor substrates 114 'tunnel' from one pressure to another, lower pressure.

It will be appreciated that in some embodiments, any number of components, modules, regions, areas, etc. are connected in series, and pumped down to different pressures. In some embodiments, the connections form a 'loop' such that semiconductor substrates 114 pass through a module, component, etc. more than once, for example.

In some embodiments, the process chambers 202 comprises plasma chambers. The process chambers 202 define an enclosed space isolated from the outside environment that can be maintained at a suitable state, such as vacuum or a below atmospheric pressure. In some embodiments, a pressure of the transfer module 210 is maintained near a pressure of the process chambers 202 so that the environment remains consistent throughout the processing and the transfers between the process chambers 202 and the load lock chambers 208. In some embodiments, the process chambers 202 are operable to perform a plasma etch process, such as plasma etching of metal, dielectric, semiconductor, and/or mask materials from the surface of the semiconductor substrates 114. In some embodiments, the process chambers 202 are operable to perform a deposition process, such as a plasma deposition of metal, dielectric, semiconductor, and/or mask materials over the surface of the semiconductor substrates 114. In some embodiments, the process chambers 202 are operable to perform a plasma treatment, such as plasma treatment of metal, dielectric, semiconductor, and/or mask materials on the surface of the semiconductor substrates 114. In some embodiments, the semiconductor substrates 114 may be a silicon substrates. In other embodiments, the semiconductor substrates 114 may comprise other elemental semiconductor materials, compound semiconductor materials, alloy semiconductor materials, or other suitable substrates. Examples of compound semiconductor materials include, but are not limited to, silicon carbide, gallium arsenic, gallium phosphide, indium phosphide, indium arsenide, and/or indium antimonide. Examples of alloy semiconductor materials include, but are not limited to, SiGe, GaAsP, AlInAs, AlGaAs, GaInAs, GaInP, and/or GaInAsP.

In some embodiments, the process chambers 202 comprises one or more gas delivery sources connected to a gas supply source for providing a processing gas to the semiconductor substrates 114. In various examples, the processing gas is an etching gas, a deposition gas, a treatment gas, a carrier gas (such as nitrogen, argon, etc.), and/or other suitable gases. The one or more gas delivery sources inject the processing gas into the enclosed space of the process chambers 202 to create a process ambient. In some embodiments, the process chambers 202 comprise a pumping module coupled to the enclosed space and operable to maintain the enclosed space at a vacuum state or at below atmospheric pressure, such as below about 5 Torr. In some embodiments, the pumping module may include one or more pumps and may utilize multiple pumping technologies, such as a positive displacement pump, a momentum transfer pump, a regenerative pump, and/or an entrapment pump. Various pumps may be configured in series according to respective working ranges.

The process chambers 202 may include a plasma power source, such as a radio frequency (RF) power source, coupled to a plasma antenna, such as a coil for an inductively coupled plasma, to maintain a plasma inside the process chamber 202. In other embodiments, the plasma antenna may include plates for a capacitively coupled plasma. The RF power source is coupled to the coil through suitable RF impedance matching circuitry. An RF energy of the coil is operable to maintain an inductively coupled plasma from the processing gas within the enclosed space for etching, deposition, and/or plasma treatment of the semiconductor substrates 114.

The front-end robot 212 transfers semiconductor substrates 114 from one or more the load lock chambers 208 to the cooling station 216 to allow cooling and outgassing of the semiconductor substrates 114. In some embodiments, the end effector 214 of the front-end robot 212 holds a single semiconductor substrate 114. In some embodiments, the end effector 214 of the front-end robot 212 holds multiple semiconductor substrates 114. In some embodiments, the cooling station 216 provides nitrogen, oxygen, or some other suitable gas to facilitate cooling and outgassing. In some embodiments, volatile components are emitted from the surface of the semiconductor substrates 114. Absent such outgassing, these volatile components can introduce defects at later processing operations.

According to some embodiments, the end effector 214 of the front-end robot 212 inserts the semiconductor substrates 114 into the cooling station 216 for a predetermined period of time or at a predetermined rate of travel and subsequently reverses direction of travel to withdraw the semiconductor substrates 114 from the cooling station 216 without releasing the semiconductor substrates 114. In some embodiments, the cooling station 216 has one or more support surfaces for holding one or more semiconductor substrates 114, such that the end effector 214 of the front-end robot 212 can place one or more semiconductor substrates 114 in the cooling station 216 and withdraw for at least a portion of the cooling to perform other tasks while the one or more semiconductor substrates 114 are cooling and outgassing.

Figure 3A:
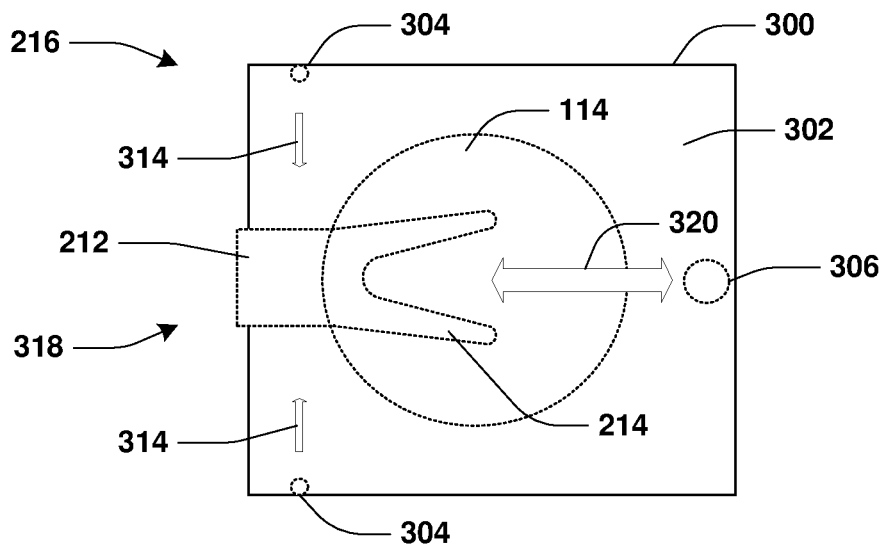
FIGS. 3A and 3B illustrate a cooling station, in accordance with some embodiments.
Figure 3A:
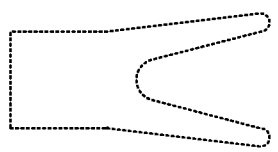
Figure 3B:
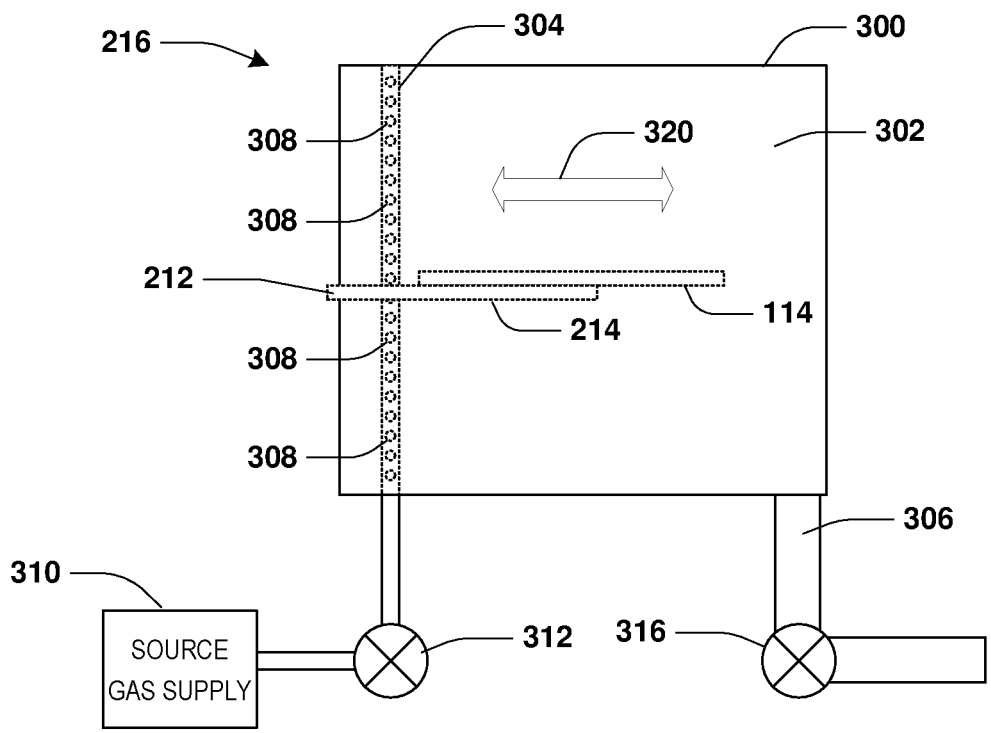

FIG. 3A is a top view of the cooling station 216, and FIG. 3B is a side view of the cooling station 216. In some embodiments, the cooling station 216 comprises a housing 300 defining an enclosure 302, one or more gas headers 304, and an exhaust port 306. In some embodiments, the cooling station 216 comprises two gas headers 304. Each of the gas headers 304 comprises one or more nozzles 308 for directing a cooling gas into the enclosure 302. A source gas supply 310 coupled to a valve 312 supplies the cooling gas to each of or at least some of the gas headers 304. In some embodiments, the gas headers 304 are made of metal materials (such as aluminum or stainless steel), dielectric materials (such as quartz, alumina, silicon nitride), or other suitable materials. According to some embodiments, exhaust from the cooling station 216 exits through the exhaust port 306. In some embodiments, an exhaust valve 316 is coupled to the exhaust port 306 to control flow of the exhaust gases.

In general, the nozzles 308 on the gas headers 304 inject the cooling gas to provide a convective heat transfer environment in the enclosure 302. In some embodiments, the cooling station 216 introduces a cooling gas at a temperature of between about 68 and 290 degrees Fahrenheit (° F.) and a flow rate of between about 0.007 and 0.1 scfm to cool and outgas the semiconductor substrates 114. In some embodiments, the front-end robot 212 transfers individual semiconductor substrates 114 to the cooling station 216. In some embodiments, the front-end robot 212 transfers multiple semiconductor substrates 114 to the cooling station 216 during the same operation. In some embodiments, the cooling station 216 holds and cools one or more semiconductor substrates 114 between transfers by the front-end robot 212.

In some embodiments, the nozzles 308 are only provided on specific surfaces of the gas headers 304 to direct the cooling gas in a particular direction, such as toward the center of the enclosure 302, as indicated by arrows 314. In some embodiments, the nozzles 308 are arranged on different surfaces of the gas headers 304 to provide a non-directional flow of the cooling gas in the enclosure 302. The number of nozzles 308 and/or the angle of nozzles 308 can be selected to provide desired gas distribution within the enclosure 302 for a particular semiconductor substrate processing regime. The nozzles 308 can have any desired shape, such as uniform diameter along the entire length thereof or other shape, such as conically tapered, flared surfaces or radially contoured surfaces. The nozzles 308 can be oriented to inject the cooling gas in any direction, including directly at the semiconductor substrates 114, at an acute angle with respect to the semiconductor substrates 114, or some other suitable angle.

In some embodiments, the cooling station 216 comprises an open end 318 that allows entry into and exit from the enclosure 302. In some embodiments, the open end 318 extends the entire end face of the housing 300. In some embodiments, the open end 318 is defined by a port in the end face of the housing 300 that is dimensioned to allow the front-end robot 212 to insert and withdraw one or more semiconductor substrates 114 into the enclosure 302. Other structures and configurations of the cooling station 216 are within the scope of the present disclosure. For example, a different number of gas headers 304 may be provided, a different configuration or orientation of gas headers 304 may be provided, and/or supports may be provided in the enclosure 302 for supporting one or more semiconductor substrates 114 placed in the cooling station 216 by the front-end robot 212.

As illustrated in FIGS. 3A and 3B, the end effector 214 of the front-end robot 212 supports one or more semiconductor substrates 114 and inserts the one or more semiconductor substrates 114 through the open end 318 into the enclosure 302. The one or more semiconductor substrates 114 travel past the gas headers 304, where the nozzles 308 inject the cooling gas provided by the source gas supply 310 through the valve 312. While in the enclosure 302, a temperature of the semiconductor substrates 114 is reduced. In some embodiments, volatile components outgas from the surface of the semiconductor substrates 114. The cooling gas and any volatile components from the outgassing exit the cooling station 216 via the exhaust port 306.

In some embodiments, the front-end robot 212 inserts the one or more semiconductor substrates 114 into the enclosure 302 for a predetermined period of time or at a predetermined rate of travel and subsequently reverses direction of travel to withdraw the one or more semiconductor substrates 114 from the enclosure 302, as indicated by the bidirectional arrows 320. After the cooling and outgassing operation is completed, the front-end robot 212 places the one or more semiconductor substrates 114 in the substrate carrier 100. In some embodiments, the injection direction of the cooling gas shown by the arrows 314 has a component perpendicular to a travel direction of the semiconductor substrates 114 in the cooling station 216 shown by arrows 320.

In some embodiments, the front-end robot 212 may place the semiconductor substrates 114 on a support surface (not shown) in the enclosure 302 and perform other tasks while the semiconductor substrates 114 are cooling and outgassing. Other structures and configurations of the end effector 214 are within the scope of the present disclosure. For example, the end effector 214 may include a conveyor belt or other transport mechanism that moves the semiconductor substrates 114 through the enclosure 302. In such an embodiment, the front-end robot 212 may deposit the semiconductor substrates 114 at a first end of the transport mechanism and withdraw to perform other tasks. Subsequently, the front-end robot 212 may retrieve the semiconductor substrates 114 from the transport mechanism at a second end of the enclosure 302 after the cooling and outgassing operation is completed and place the semiconductor substrates 114 in the substrate carrier 100.

Figure 4:
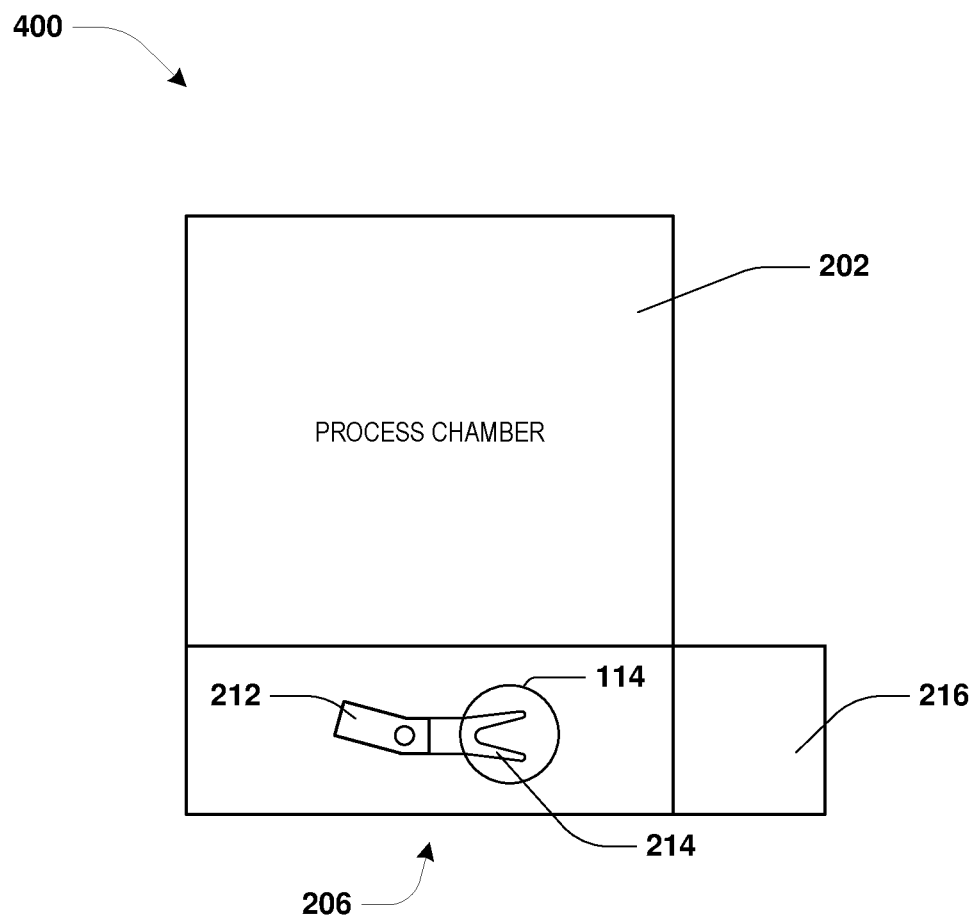
FIG. 4 is a top view of a processing tool, in accordance with some embodiments.

FIG. 4 is a top view of a processing tool 400, in accordance with some embodiments. In some embodiments, the processing tool 400 comprises the process chamber 202 and the front-end interface unit 206. In some embodiments, the front-end interface unit 206 comprises the cooling station 216 and the front-end robot 212 having the end effector 214 to transfer the semiconductor substrate 114 from the processing chamber 202 to the cooling station 216 to allow cooling and outgassing of the semiconductor substrate 114.

Figure 5:
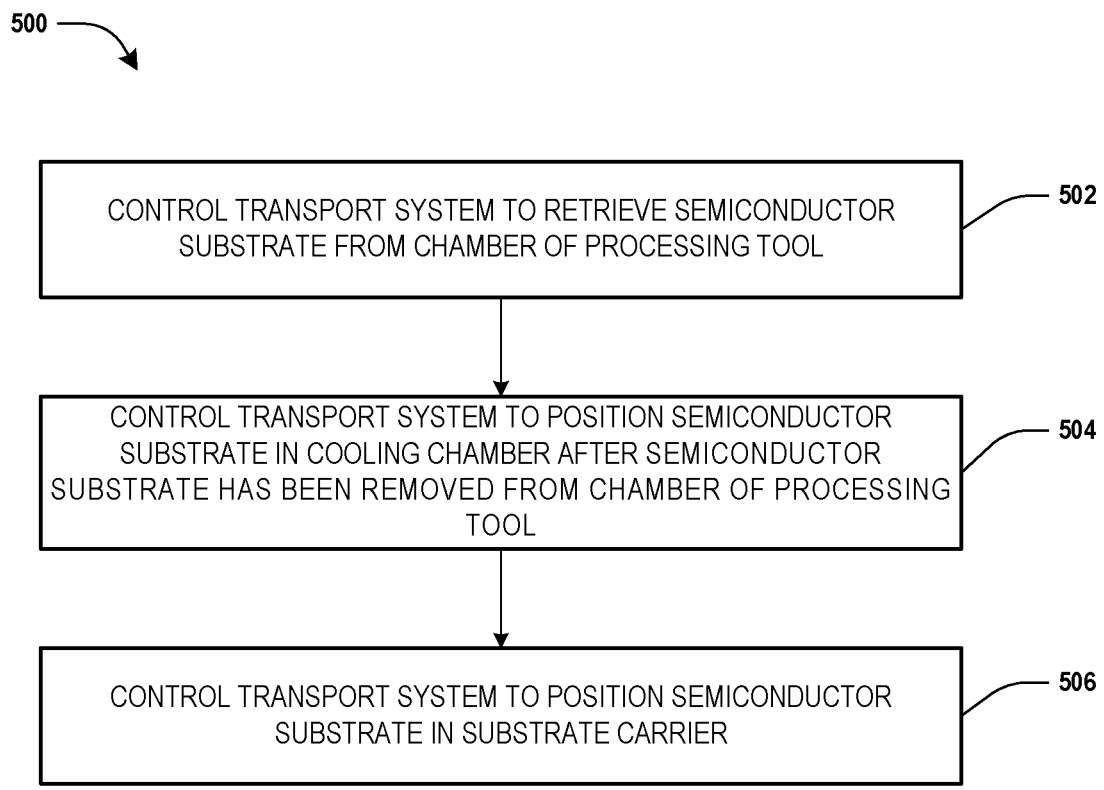
FIG. 5 is a flow chart illustrating a method of handling a semiconductor substrate, in accordance with some embodiments.

FIG. 5 is a flow diagram illustrating a method 500 for handling semiconductor substrates 114, in accordance with some embodiments. According to some embodiments, the method is performed by a controller 222, as illustrated in FIG. 2, comprising a computing device that executes computer-executable instructions stored in a non-transitory computer readable medium.

In some embodiments, at 502, the controller 222 controls a transport system to retrieve semiconductor substrates 114 from a chamber of a processing tool 200. In some embodiments, the chamber is a load lock chamber 208 of a cluster tool. In some embodiments, where the processing tool 200 includes only one process chamber 202, the chamber is the process chamber 202. In some embodiments, the transport system comprises the transfer robot 218 of the transfer module 210 for transporting the semiconductor substrates 114 between the process chamber 202 and the load lock chamber 208 and/or the front-end robot 212 for transporting the semiconductor substrates 114 between the load lock chamber 208 and the cooling station 216 and/or the substrate carrier 100 at the load port module 207.

At 504, the controller 222 controls the transport system to position the semiconductor substrates 114 in the cooling station 216 after the semiconductor substrates 114 have been removed from the chamber of the processing tool 200 (e.g., have been removed from the load lock chamber 208 or the process chamber 202 if the processing tool 200 only includes one process chamber 202). In some embodiments, the transport system inserts the semiconductor substrates 114 into the cooling station 216 and removes the semiconductor substrates 114 from the cooling station 216 while supporting the semiconductor substrate 114 during the entire cooling operation. In some embodiments, the transport system places the semiconductor substrate 114 in the cooling station 216 and withdraws to allow other tasks to be performed by the transport system.

At 506, the controller 222 controls the transport system to position the semiconductor substrates 114 in a substrate carrier 100 at the load port module 207. The cooling provided by the cooling station 216 reduces condensation that forms on the semiconductor substrates 114 while positioned in the substrate carrier 100 and waiting for the processing of other semiconductor substrates 114 to be completed.

Figure 6:
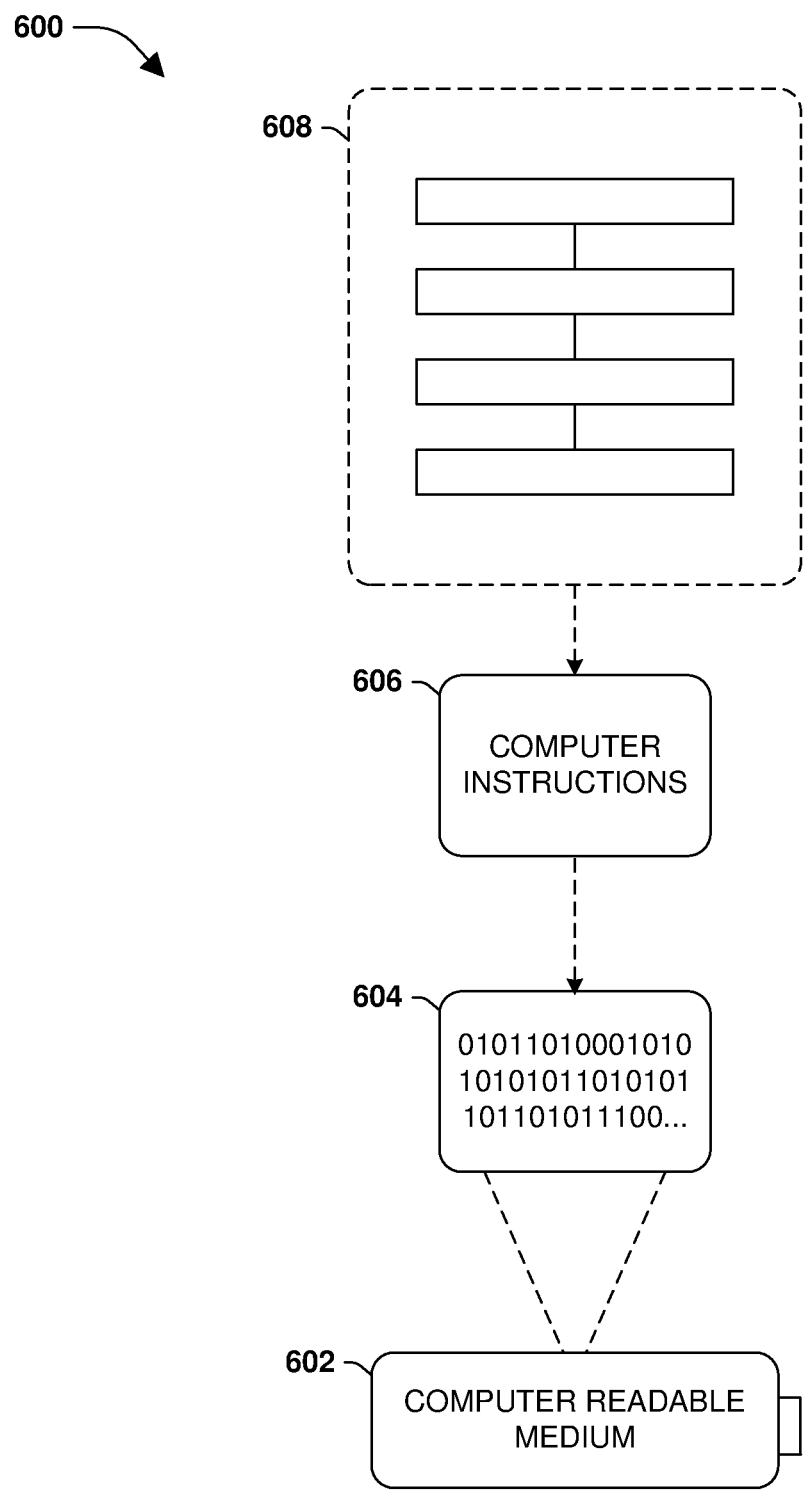
FIG. 6 illustrates an example computer-readable medium wherein processor-executable instructions configured to embody one or more of the provisions set forth herein may be comprised, in accordance with some embodiments.

Still another embodiment involves a computer-readable medium comprising processor-executable instructions configured to implement one or more of the techniques presented herein. An exemplary computer-readable medium is illustrated in FIG. 6, wherein the embodiment 600 comprises a computer-readable medium 602 (e.g., a CD-R, DVD-R, flash drive, a platter of a hard disk drive, etc.), on which is encoded computer-readable data 604. This computer-readable data 604 in turn comprises a set of processor-executable computer instructions 606 configured to operate according to one or more of the principles set forth herein. In some embodiments 600, the processor-executable computer instructions 606 are configured to perform a method 608, such as at least some of the aforementioned described methods. In some embodiments, the processor-executable computer instructions 606 are configured to implement a system, such as at least some of the aforementioned systems. Many such computer-readable media may be devised by those of ordinary skill in the art that are configured to operate in accordance with the techniques presented herein.

Figure 7:
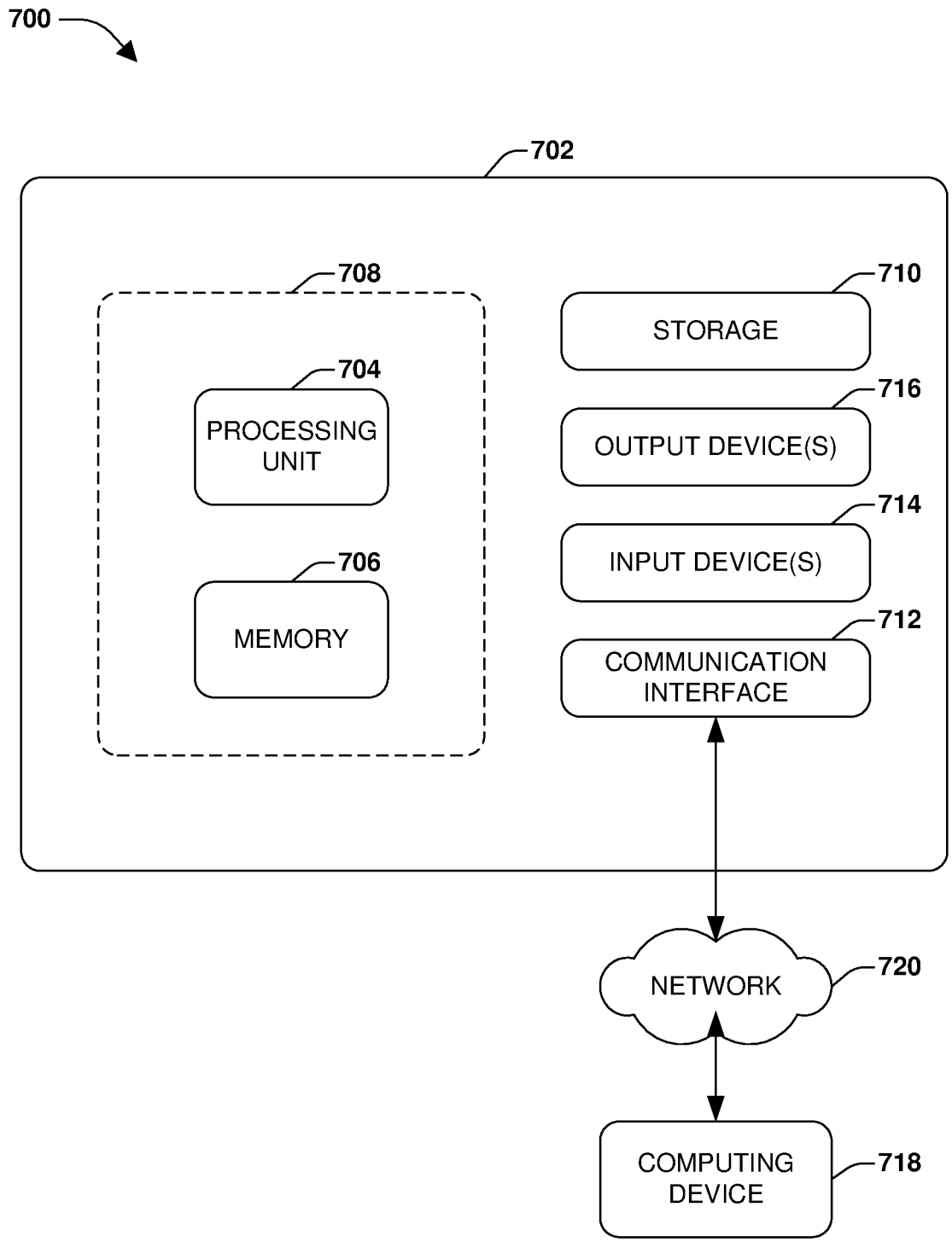
FIG. 7 illustrates an example computing environment wherein one or more of the provisions set forth herein may be implemented, in accordance with some embodiments.

FIG. 7 and the following discussion provide a brief, general description of a suitable computing environment to implement embodiments of one or more of the provisions set forth herein. The operating environment of FIG. 7 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 7 depicts an example of a system 700 comprising a computing device 702 configured as the controller 222 to implement some embodiments provided herein. In some configurations, computing device 702 includes at least one processing unit 704 and memory 706. Depending on the exact configuration and type of computing device, the memory 706 may be volatile (such as RAM, for example), non-volatile (such as ROM, flash memory, etc., for example), or some combination of the two. This configuration is illustrated in FIG. 7 by dashed line 708.

In some embodiments, the computing device 702 may include additional features and/or functionality. For the example, the computing device 702 may also include additional storage (e.g., removable and/or non-removable) including, but not limited to, magnetic storage, optical storage, and the like. Such additional storage is illustrated in FIG. 7 by storage 710. In some embodiments, computer readable instructions to implement one or more embodiments provided herein may be in the storage 710. The storage 710 may also store other computer readable instructions to implement an operating system, an application program, and the like. Computer readable instructions may be loaded in the memory 706 for execution by processing unit 704, for example.

The term "computer readable media" as used herein includes computer storage media. Computer storage media includes volatile and nonvolatile, removable and non-removable media implemented in any method or technology for storage of information such as computer readable instructions or other data. The memory 706 and storage 710 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by the computing device 702. Any such computer storage media may be part of the computing device 702.

In some embodiments, the computing device 702 comprises a communication interface 712, or a multiple communication interfaces, that allow the computing device 702 to communicate with other devices. The communication interface 712 may include, but is not limited to, a modem, a Network Interface Card (NIC), an integrated network interface, a radio frequency transmitter/receiver, an infrared port, a Universal Serial Bus (USB) connection, or other interface for connecting the computing device 702 to other computing devices. The communication interface 712 may implement a wired connection or a wireless connection. The communication interface 712 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 702 may include input device(s) 714 such as keyboard, mouse, pen, voice input device, touch input device, infrared cameras, video input devices, and/or any other suitable input device. An output device(s) 716 such as one or more displays, speakers, printers, and/or any other suitable output device may also be included in the computing device 702. The input device(s) 714 and the output device(s) 716 may be connected to the computing device 702 via a wired connection, wireless connection, or any combination thereof. In some embodiments, an input device or an output device from another computing device may be used as the input device(s) 714 or the output device(s) 716 for the computing device 702.

Components of the computing device 702 may be connected by various interconnects, such as a bus. Such interconnects may include a Peripheral Component Interconnect (PCI), such as PCI Express, a USB, firewire (IEEE 1394), an optical bus structure, and the like. In some embodiments, components of the computing device 702 may be interconnected by a network. For example, the memory 706 may be comprised of multiple physical memory units located in different physical locations interconnected by a network.

Those skilled in the art will realize that storage devices utilized to store computer readable instructions may be distributed across a network. For example, a computing device 718 accessible via a network 720 may store computer readable instructions to implement one or more embodiments provided herein. The computing device 702 may access the computing device 718 and download a part or all of the computer readable instructions for execution. Alternatively, the computing device 702 may download pieces of the computer readable instructions, as needed, or some instructions may be executed at the computing device 702 and some instructions may be executed at the computing device 718.

In some embodiments, cooling the semiconductor substrates 114 removed from the load lock chamber 208 in the cooling station 216 prior to placing the semiconductor substrates 114 in the substrate carrier 100 increases throughput of the processing tool 200 since convective heat transfer in the cooling station 216 cools the semiconductor substrates 114 more effectively than conductive heat transfer in the front-end interface unit without the cooling station 216. Increased throughput and reduced defects increases the efficiency of the fabrication process and potentially increases the performance and/or yield of semiconductor die fabricated on the semiconductor substrates 114. The cooling provided by the cooling station 216 reduces condensation that subsequently forms on the semiconductor substrates 114 while positioned in the substrate carrier 100 and waiting for the processing of other semiconductor substrates 114 to be completed, thereby reducing defects. The provision of the semiconductor substrates 114 in the cooling station 216 also facilitates outgassing of volatile components from the surface of the semiconductor substrates 114, which also tends to reduce defects in subsequent processing operations. Increased throughput and reduced defects increases the efficiency of the fabrication process and potentially increases the performance and/or yield of semiconductor die fabricated on the semiconductor substrates 114.

According to some embodiments, a process tool includes a process chamber configured to perform a process operation, a load lock chamber, and a cooling station. The load lock chamber is between the process chamber and the cooling station. The process tool also includes a transport system is configured to retrieve a semiconductor substrate from the process chamber, position the semiconductor substrate in the cooling station and maintain the semiconductor substrate in the cooling station during a cooling operation after retrieving the semiconductor substrate from the process chamber and passing the semiconductor substrate through the load lock chamber disposed between the process chamber and the cooling station, and position the semiconductor substrate in a substrate carrier after the cooling operation.

According to some embodiments, a method includes controlling a transport system to retrieve a semiconductor substrate from a first chamber of a processing tool, controlling the transport system to position the semiconductor substrate in a cooling station during a cooling operation after the semiconductor substrate has been retrieved from the first chamber, and controlling the transport system to position the semiconductor substrate in a substrate carrier after the cooling operation.

According to some embodiments, a process tool includes a process chamber configured to perform a process operation, a load lock chamber, a transfer robot configured to travel between the process chamber and the load lock chamber, a cooling station configured to perform a cooling operation, a load port module, and a front-end robot configured to travel between the load lock chamber and the cooling station and to travel between the cooling station and the load port module.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc., depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A process tool, comprising:
   a process chamber configured to perform a process operation;
   a load lock chamber;
   a cooling station, wherein:
      the load lock chamber is between the process chamber and the cooling station, and
      the cooling station comprises:
         a first nozzle configured to emit cooling gas in a first direction;
         a second nozzle configured to emit the cooling gas in a second direction different than the first direction; and
         an exhaust port separated from the first nozzle and the second nozzle in a third direction;
   a transport system; and
   a controller configured to control the transport system to:
      retrieve a semiconductor substrate from the process chamber;
      position the semiconductor substrate in the cooling station after retrieving the semiconductor substrate from the process chamber, passing the semiconductor substrate through the load lock chamber disposed between the process chamber and the cooling station, and passing the semiconductor substrate between the first nozzle and the second nozzle by moving the semiconductor substrate in the third direction from an open end of the cooling station, fully past the first nozzle and the second nozzle, and toward the exhaust port after fully passing by the first nozzle and the second nozzle;
      maintain the semiconductor substrate in the cooling station during a cooling operation by supporting the semiconductor substrate after positioning the semiconductor substrate in the cooling station; and
      position the semiconductor substrate in a substrate carrier after the cooling operation.

2. The process tool of claim 1, comprising:
   a front-end interface unit comprising a load port module and a front-end robot; and a transfer robot configured to move the semiconductor substrate from the process chamber to the load lock chamber after the process operation, wherein the transport system comprises the front-end robot.

3. The process tool of claim 1, wherein the transport system is configured to support the semiconductor substrate during an entirety of the cooling operation.

4. The process tool of claim 1, wherein the cooling gas comprises at least one of oxygen or nitrogen.

5. The process tool of claim 1, wherein the cooling station comprises:
a housing defining an enclosure; and
a gas header comprising the first nozzle for introducing the cooling gas into the enclosure, wherein the exhaust port removes the cooling gas and one or more volatile components outgassing from the semiconductor substrate during the cooling operation from the enclosure.

6. The process tool of claim 1, wherein the first direction is opposite to the second direction.

7. The process tool of claim 6, wherein the third direction is perpendicular to the first direction and is perpendicular to the second direction.

8. A process tool, comprising:
a process chamber configured to perform a process operation;
a load lock chamber;
a transfer robot configured to travel between the process chamber and the load lock chamber;
a cooling station configured to perform a cooling operation and disposed on an opposite side of the process chamber relative to the load lock chamber such that a semiconductor substrate passes at least one of:
from the cooling station to the load lock chamber and then to the process chamber after passing through the load lock chamber, or
from the process chamber to the load lock chamber and then to the cooling station after passing through the load lock chamber, wherein:
the cooling station comprises a gas header extending from a bottom of a housing in which the semiconductor substrate is disposed when the semiconductor substrate is positioned in the cooling station to a top of the housing,
the gas header comprises a plurality of nozzles configured to emit a cooling gas in a first direction and an exhaust port for removing the cooling gas,
the plurality of nozzles are arranged in a stack extending in a second direction different than the first direction,
the exhaust port is spaced apart from the plurality of nozzles in a third direction different than the first direction and the second direction,
the first direction and the third direction are parallel to a top surface of the semiconductor substrate when the semiconductor substrate is positioned in the cooling station, and
a plane in which the top surface of the semiconductor substrate lies intersects the gas header through which the cooling gas flows when the semiconductor substrate is positioned in the cooling station;
a load port module; and
a front-end robot configured to travel between the load lock chamber and the cooling station and to travel between the cooling station and the load port module.

9. The process tool of claim 8, wherein the front-end robot is configured to maintain a semiconductor substrate in the cooling station during the cooling operation by supporting the semiconductor substrate after positioning the semiconductor substrate in the cooling station.

10. The process tool of claim 8, comprising a controller configured to:
direct the transfer robot to travel from the process chamber to the load lock chamber after the process operation;
direct the front-end robot to travel from the load lock chamber to the cooling station before the cooling operation; and
direct the front-end robot to travel from the cooling station to the load port module after the cooling operation.

11. The process tool of claim 8, wherein:
the second direction is perpendicular to the first direction, and
the third direction is perpendicular to the first direction and the second direction.

12. The process tool of claim 8, wherein:
a sidewall of the cooling station defines an open end, and
the front-end robot is configured to position the semiconductor substrate in the cooling station by moving the semiconductor substrate into the cooling station from the open end in the third direction.

13. A method comprising:
controlling a transport system to retrieve a semiconductor substrate from a first chamber of a processing tool;
controlling the transport system to position the semiconductor substrate in a cooling station during a cooling operation after the semiconductor substrate has been retrieved from the first chamber, wherein the transport system is configured to position the semiconductor substrate in the cooling station by moving the semiconductor substrate in a first direction from an open end of the cooling station and by moving the semiconductor substrate between a first nozzle configured to emit cooling gas and a second nozzle configured to emit the cooling gas and spaced apart from the first nozzle in a second direction perpendicular to the first direction and moving the semiconductor substrate toward an exhaust port after moving the semiconductor substrate fully passed the first nozzle and the second nozzle; and
controlling the transport system to position the semiconductor substrate in a substrate carrier after the cooling operation.

14. The method of claim 13 comprising:
controlling a transfer robot to move the semiconductor substrate from a process chamber to a load lock chamber after a process operation, wherein:
the first chamber comprises the load lock chamber, and
the transport system comprises a front-end robot.

15. The method of claim 13, comprising:
supporting the semiconductor substrate using the transport system during the cooling operation.

16. The method of claim 13, comprising:
controlling the transport system to place the semiconductor substrate in the cooling station and withdraw during the cooling operation.

17. The method of claim 13, comprising:
supporting the semiconductor substrate using the transport system during an entirety of the cooling operation.

18. The method of claim 13, comprising controlling the first nozzle to direct the cooling gas in the second direction.

19. The method of claim 18, wherein the first direction and the second direction are parallel to a top surface of the semiconductor substrate when the semiconductor substrate is positioned in the cooling station.

20. The method of claim 13, wherein the cooling gas comprises at least one of oxygen or nitrogen.

\* \* \* \* \*